US012376411B2

(12) United States Patent
Yang et al.

(10) Patent No.: US 12,376,411 B2
(45) Date of Patent: Jul. 29, 2025

(54) IMAGE SENSING DEVICE INCLUDING THROUGH SILICON VIA (TSV) STRUCTURE

(71) Applicant: SK hynix Inc., Icheon-si (KR)

(72) Inventors: Yun Hui Yang, Icheon-si (KR); Ji Suk Park, Icheon-si (KR); Tae Yang Lee, Icheon-si (KR)

(73) Assignee: SK HYNIX INC., Icheon-si (KR)

(*) Notice: Subject to any disclaimer, the term of this patent is extended or adjusted under 35 U.S.C. 154(b) by 559 days.

(21) Appl. No.: 17/725,845

(22) Filed: Apr. 21, 2022

(65) Prior Publication Data

US 2023/0083783 A1 Mar. 16, 2023

(51) Int. Cl.
*H10F 39/00* (2025.01)
*H01L 23/48* (2006.01)

(52) U.S. Cl.
CPC ......... *H10F 39/809* (2025.01); *H01L 23/481* (2013.01); *H10F 39/811* (2025.01)

(58) Field of Classification Search
CPC ............. H01L 21/76898; H01L 23/481; H10F 39/026; H10F 39/802; H10F 39/803; H10F 39/809; H10F 39/811; H10F 39/8053; H10F 39/8063
See application file for complete search history.

(56) References Cited

U.S. PATENT DOCUMENTS 9,773,831 B1* 9/2017 Yang .................. H01L 27/14621
2012/0164829 A1* 6/2012 Rajagopalan ........... H01L 24/13
438/675
2014/0264683 A1* 9/2014 Kao .................. H01L 27/14641
257/431
2015/0102497 A1* 4/2015 Park .................. H01L 21/76898
257/774
2020/0043969 A1* 2/2020 Guan .................. H01L 27/1469
2021/0087053 A1* 3/2021 Weidner .............. H01L 21/2885

FOREIGN PATENT DOCUMENTS

| KR | 20100053063 A | 5/2010 |
| KR | 20190038031 A | 4/2019 |
| KR | 20200038147 A | 4/2020 |

OTHER PUBLICATIONS

Request for the Submission of an Opinion for KR Appl. No. 10-2021-0122400, mailed on May 28, 2025, 14 pages with English translation.

* cited by examiner

*Primary Examiner* — Fazli Erdem
(74) *Attorney, Agent, or Firm* — Perkins Coie LLP

(57) ABSTRACT

An image sensing device includes a first substrate including a first front surface and a first back surface, a first interlayer insulation layer disposed below the first front surface and including a first interconnect, a second substrate including a second front surface and a second back surface, a second interlayer insulation layer disposed over the second front surface and below the first interlayer insulation layer to be in contact with the first interlayer insulation layer, and including a second interconnect, a first TSV disposed in a through hole formed by penetrating the first substrate and the first interlayer insulation layer and by etching of a portion of the second interlayer insulation layer, and electrically connecting the first interconnect to the second interconnect, and a passivation layer formed to cover the first TSV. An upper end of the first TSV is located at a height lower than the first back surface.

20 Claims, 12 Drawing Sheets

IMAGE SENSING DEVICE INCLUDING THROUGH SILICON VIA (TSV) STRUCTURE

CROSS-REFERENCE TO RELATED APPLICATION

This patent document claims the priority and benefits of Korean patent application No. 10-2021-0122400, filed on Sep. 14, 2021, which is incorporated by reference in its entirety as part of the disclosure of this patent document.

TECHNICAL FIELD

The technology and implementations disclosed in this patent document generally relate to an image sensing device including a through silicon via (TSV) structure.

BACKGROUND

An image sensor is used in electronic devices to convert optical images into electrical signals. With the recent development of automotive, medical, computer and communication industries, the demand for highly integrated, higher-performance image sensors has been rapidly increasing in various electronic devices such as digital cameras, camcorders, personal communication systems (PCSs), video game consoles, surveillance cameras, medical micro-cameras, robots, etc.

In an attempt to achieve the demanded resolution and high-speed operation, image sensor manufacturers are developing multi-layer image sensors that include upper layers stacked on lower layers and through silicon via (TSV) structures that electrically connect circuits of the upper and lower layers to each other.

SUMMARY

Various embodiments of the disclosed technology relate to an image sensing device including a through silicon via (TSV) structure with improved reliability.

In an embodiment of the disclosed technology, an image sensing device may include a first substrate including a first front surface and a first back surface opposite to the first front surface, a first interlayer insulation layer disposed below the first front surface and structured to include a first interconnect, a second substrate including a second front surface and a second back surface opposite to the second front surface, a second interlayer insulation layer disposed over the second front surface and below the first interlayer insulation layer to be in contact with the first interlayer insulation layer, and structured to include a second interconnect, a first through silicon via (TSV) disposed in a through hole that is formed by penetrating the first substrate and the first interlayer insulation layer and by etching of a portion of the second interlayer insulation layer, and structured to electrically connect the first interconnect to the second interconnect, and a passivation layer structured to cover the first TSV. An upper end of the first TSV is located at a height lower than the first back surface.

In another embodiment of the disclosed technology, an image sensing device may include a first structure, a second structure in contact with a front surface of the first structure, and a through silicon via (TSV). The first structure may include a first substrate structured to include a plurality of unit pixels generating pixel signals through conversion of incident light, and a first interlayer insulation layer structured to cover the first substrate and include a first interconnect that transmits the pixel signals. The second structure may include a second substrate structured to have electronic elements that generate images by processing the pixel signals, and a second interlayer insulation layer structured to cover the second substrate and include a second interconnect that transmits the pixel signals to the electronic elements. The through silicon via (TSV) may electrically connect the first interconnect to the second interconnect. At a back surface of the first structure, an end portion of the TSV may be located at a height lower than a surface of the first substrate.

In another embodiment of the disclosed technology, an image sensing device may include a first substrate, a plurality of image sensing pixels supported by the first substrate and configured to respond to incident light to generate photocharge, wherein output signals from the image sensing pixels collectively carry image information in the incident light, a first interlayer insulation layer disposed below the first substrate and structured to include a first interconnect, a second substrate disposed below the first interlayer insulation layer, imaging sensing circuits supported by the second substrate and structured to include driving circuits for operating the image sensing pixels, a second interlayer insulation layer disposed between the first interlayer insulation layer and the second substrate, the second interlayer insulation layer structured to include a second interconnect, a first through silicon via (TSV) formed in a through hole penetrating the first substrate, the first interlayer insulation layer and an upper portion of the second interlayer insulation layer, the first TSV structured to electrically connect the first interconnect to the second interconnect to provide electrical connections between the imaging sensing circuits and the image sensing pixels, and a passivation layer formed to cover the first TSV, wherein the first TSV is formed between an inner surface of the through hole and the passivation layer and enclosed by the inner surface of the through hole and the passivation layer.

In another embodiment of the disclosed technology, an image sensing device may include a first substrate including a first front surface and a first back surface opposite to the first front surface, a first interlayer insulation layer disposed below the first front surface, and configured to include a first metal line, a second substrate including a second front surface and a second back surface opposite to the second front surface, a second interlayer insulation layer disposed over the second front surface to be in contact with the first interlayer insulation layer, and configured to include a second metal line, a first through silicon via (TSV) formed to penetrate the first substrate and the first interlayer insulation layer, disposed in a through hole formed by etching of a portion of the second interlayer insulation layer, and configured to interconnect the first metal line and the second metal line, and a passivation layer formed to cover the first TSV. The first TSV may be formed in the through hole by which an upper end of the first TSV is located to be lower than the first back surface.

In another embodiment of the disclosed technology, an image sensing device may include a first stacked structure, a second stacked structure, and a through silicon via (TSV). The first stacked structure may include a first substrate in which a plurality of unit pixels generating pixel signals through conversion of incident light is formed, and a first interlayer insulation layer formed to include a first metal line that covers the first substrate and transmits the pixel signals. The second stacked structure may include a second substrate stacked with the first stacked structure so as to be in contact with a front surface of the first stacked structure, and formed to have electronic elements that form images by processing the pixel signals, and a second interlayer insulation layer formed to include a second metal line that covers the second substrate and transmits the pixel signals to the electronic elements. The through silicon via (TSV) may electrically interconnect the first metal line and the second metal line. At a back surface of the first stacked structure, an end portion of the through silicon via (TSV) may be located to be lower than a surface of the first substrate.

It is to be understood that both the foregoing general description and the following detailed description of the disclosed technology are illustrative and explanatory and are intended to provide further explanation of the disclosure as claimed.

DETAILED DESCRIPTION

This patent document provides implementations and examples of an image sensing device including a through silicon via (TSV) structure that may be used to substantially address one or more technical or engineering issues and mitigate limitations or disadvantages encountered in some other image sensing devices. Some implementations of the disclosed technology suggest designs of an image sensing device including a through silicon via (TSV) structure with improved reliability. The disclosed technology provides various implementations of an image sensing device which can improve reliability (e.g., this type of reliability can be measured by using Temperature Humidity with Bias (THB) testing) by preventing the through silicon via (TSV) structure from being exposed outside the substrate.

Reference will now be made in detail to certain embodiments, examples of which are illustrated in the accompanying drawings. Wherever possible, the same reference numbers will be used throughout the drawings to refer to the same or similar parts. In the following description, a detailed description of related known configurations or functions incorporated herein will be omitted to avoid obscuring the subject matter.

Hereafter, various embodiments will be described with reference to the accompanying drawings. However, it should be understood that the disclosed technology is not limited to specific embodiments, but includes various modifications, equivalents and/or alternatives of the embodiments. The embodiments of the disclosed technology may provide a variety of effects capable of being directly or indirectly recognized through the disclosed technology.

Figure 1:
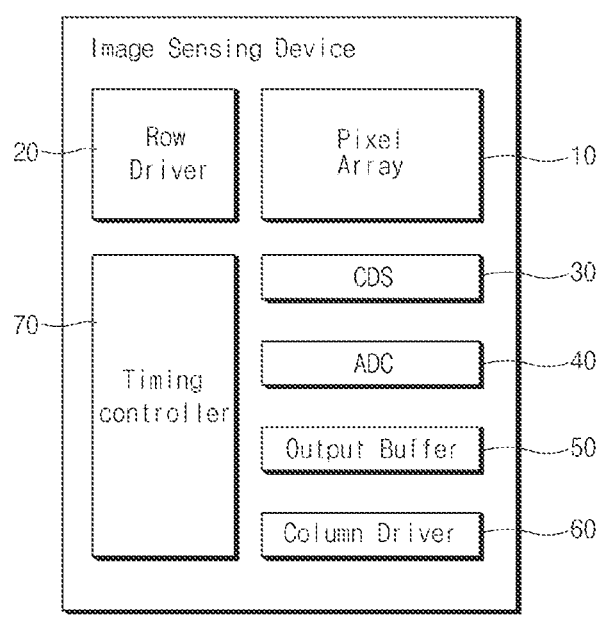
FIG. 1 is a block diagram illustrating an example of an image sensing device based on some implementations of the disclosed technology.

FIG. 1 is a block diagram illustrating an image sensing device based on some implementations of the disclosed technology.

Referring to FIG. 1, the image sensing device may include a pixel array 10, a row driver 20, a correlated double sampler (CDS) 30, an analog-digital converter (ADC) 40, an output buffer 50, a column driver 60 and a timing controller 70. The components of the image sensing device illustrated in FIG. 1 are discussed by way of example only, and this patent document encompasses numerous other changes, substitutions, variations, alterations, and modifications. In this patent document, the word "pixel" can be used to indicate an image sensing pixel that is structured to detect incident light to generate electrical signals carrying images in the incident light, and a phase detection pixel that is structured to generate second electrical signals for calculating a phase difference between the images.

The pixel array 10 may include a plurality of unit pixels arranged in rows and columns. In one example, the plurality of unit pixels can be arranged in a two dimensional (2D) pixel array including rows and columns. In another example, the plurality of unit pixels can be arranged in a three dimensional (3D) pixel array. The plurality of unit pixels may convert an optical signal into an electrical signal on a unit pixel basis or a pixel group basis, where unit pixels in a pixel group share at least certain internal circuitry. The plurality of unit pixels may include a plurality of image sensing pixels and a plurality of phase detection pixels. Each of the image sensing pixels may generate an image signal acting as an electrical signal corresponding to a target object to be captured.

The pixel array 10 may receive driving signals (for example, a row selection signal, a reset signal, a transmission (or transfer) signal, etc.) from the row driver 20. Upon receiving the driving signal, the unit pixels may be activated to perform the operations corresponding to the row selection signal, the reset signal, and the transfer signal.

The row driver 20 may activate the pixel array 10 to perform certain operations on the unit pixels in the corresponding row based on control signals provided by controller circuitry such as the timing controller 70. In some implementations, the row driver 20 may select one or more pixel groups arranged in one or more rows of the pixel array 10. The row driver 20 may generate a row selection signal to select one or more rows from among the plurality of rows. The row driver 20 may sequentially enable the reset signal and the transfer signal for the unit pixels arranged in the selected row. The pixel signals generated by the unit pixels arranged in the selected row may be output to the correlated double sampler (CDS) 30.

The correlated double sampler (CDS) 30 may remove undesired offset values of the unit pixels using correlated double sampling. In one example, the correlated double sampler (CDS) 30 may remove the undesired offset values of the unit pixels by comparing output voltages of pixel signals (of the unit pixels) obtained before and after photocharges generated by incident light are accumulated in the sensing node (i.e., a floating diffusion (FD) node). As a result, the CDS 30 may obtain a pixel signal generated only by the incident light without causing noise. In some implementations, upon receiving a clock signal from the timing controller 70, the CDS 30 may sequentially sample and hold voltage levels of the reference signal and the pixel signal, which are provided to each of a plurality of column lines from the pixel array 10. That is, the CDS 30 may sample and hold the voltage levels of the reference signal and the pixel signal which correspond to each of the columns of the pixel array 10. In some implementations, the CDS 30 may transfer the reference signal and the pixel signal of each of the columns as a correlate double sampling (CDS) signal to the ADC 40 based on control signals from the timing controller 70.

The ADC 40 is used to convert analog CDS signals received from the CDS 30 into digital signals. In some implementations, the ADC 40 may be implemented as a ramp-compare type ADC. The analog-to-digital converter (ADC) 40 may compare a ramp signal received from the timing controller 70 with the CDS signal received from the CDS 30, and may thus output a comparison signal indicating the result of comparison between the ramp signal and the CDS signal. The analog-to-digital converter (ADC) 40 may count a level transition time of the comparison signal in response to the ramp signal received from the timing controller 70, and may output a count value indicating the counted level transition time to the output buffer 50.

The output buffer 50 may temporarily store column-based image data provided from the ADC 40 based on control signals of the timing controller 70. The image data received from the ADC 40 may be temporarily stored in the output buffer 50 based on control signals of the timing controller 70. The output buffer 50 may provide an interface to compensate for data rate differences or transmission rate differences between the image sensing device and other devices.

The column driver 60 may select a column of the output buffer 50 upon receiving a control signal from the timing controller 70, and sequentially output the image data, which are temporarily stored in the selected column of the output buffer 50. In some implementations, upon receiving an address signal from the timing controller 70, the column driver 60 may generate a column selection signal based on the address signal, may select a column of the output buffer 50 using the column selection signal, and may control the image data received from the selected column of the output buffer 50 to be output as an output signal.

The timing controller 70 may generate signals for controlling operations of the row driver 20, the ADC 40, the output buffer 50 and the column driver 60. The timing controller 70 may provide the row driver 20, the column driver 60, the ADC 40, and the output buffer 50 with a clock signal required for the operations of the respective components of the image sensing device, a control signal for timing control, and address signals for selecting a row or column. In some implementations, the timing controller 70 may include a logic control circuit, a phase lock loop (PLL) circuit, a timing control circuit, a communication interface circuit and others.

Figure 2:
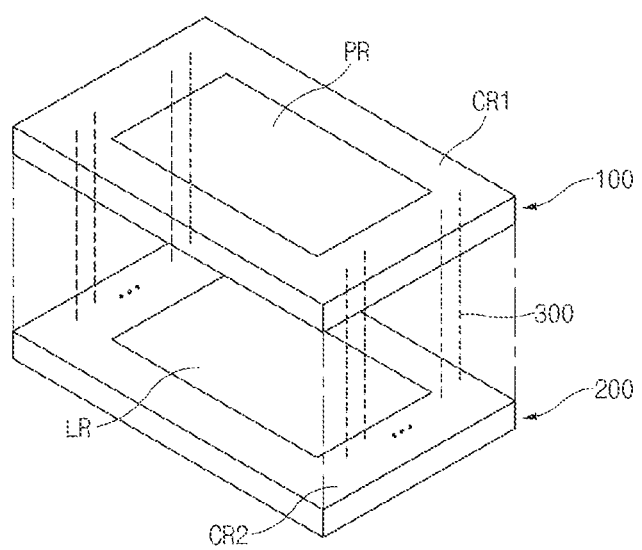
FIG. 2 is a perspective view schematically illustrating an example structure of an image sensing device based on some implementations of the disclosed technology.
Figure 3:
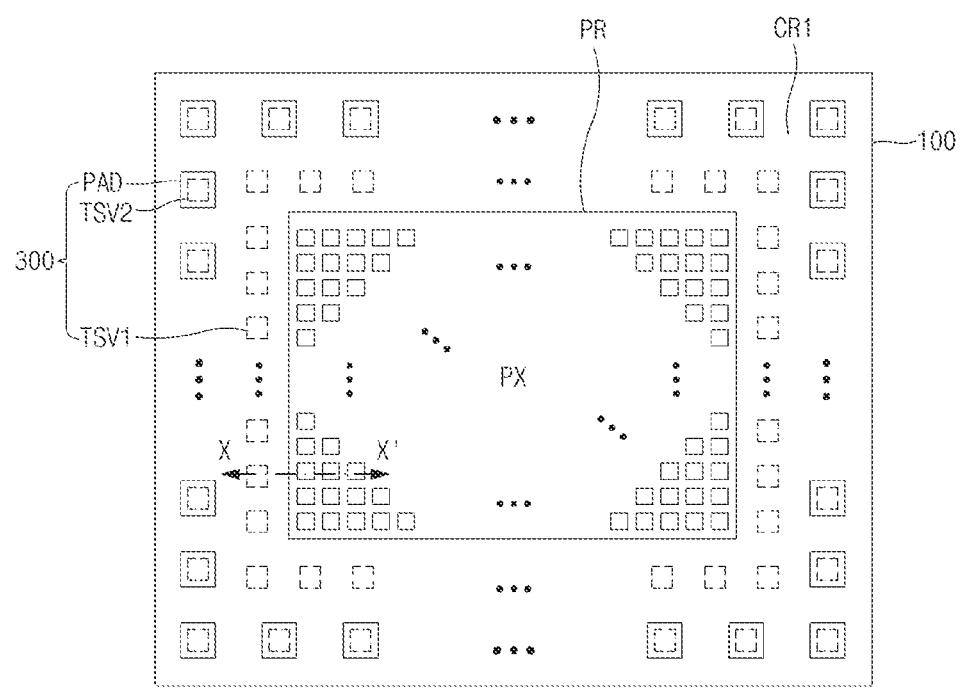
FIG. 3 is a plan view illustrating an example of a planar arrangement structure of a first structure for use in the image sensing device shown in FIG. 2 based on some implementations of the disclosed technology.

FIG. 2 is a perspective view schematically illustrating an example structure of an image sensing device based on some implementations of the disclosed technology. FIG. 3 is a plan view illustrating an example of a planar arrangement structure of a first structure for use in the image sensing device shown in FIG. 2 based on some implementations of the disclosed technology.

Referring to FIGS. 2 and 3, the image sensing device may include a first structure 100, a second structure 200, and a through silicon via (TSV) structure 300. Here, each structure may indicate a layer of a multi-layer structure. Therefore, a plurality of structures may be stacked over one another to form a multi-layer image sensing device.

The first structure 100 may be stacked and disposed over the second structure 200. The first structure 100 may include a pixel region (PR) in which the pixel array 10 shown in FIG. 1 is formed, and a first connection region (CR1) located outside the pixel region (PR). The pixel region (PR) may be disposed at a center portion of the first structure 100. The pixel region (PR) may include a plurality of unit pixels (PXs) arranged in rows and columns. Each unit pixel (PX) may include a photoelectric conversion element, a color filter, a microlens, a plurality of pixel transistors. The first connection region (CR1) may include a through silicon via (TSV) structure 300 for electrically connecting the first structure 100 and the second structure 200 to each other or for electrically connecting the first structure 100 and the second structure 200 to an external device. The first structure 100 may include interconnects such as metal interconnects (e.g., metal bonding wires) formed in the pixel region (PR) and the first connection region (CR1). The interconnects of the first structure 100 may be electrically coupled to the unit pixels (PXs) and the TSV structure 300.

The second structure 200 may include a logic region (LR) in which the row driver 20, the CDS 30, the ADC 40, the output buffer 50, the column driver 60, and the timing controller 70 shown in FIG. 1 are formed, and a second connection region (CR2) located outside the logic region (LR). The logic region (LR) may be disposed at a center portion of the second structure 200. The logic region (LR) may include electronic elements (e.g., transistors) that generate control signals to control operations of the unit pixels (PXs) and generate images by processing pixel signals output from the unit pixels (PXs). The second connection region (CR2) may be formed to vertically overlap with the first connection region (CR1). A portion of the TSV structure 300 may be formed in the second connection region (CR2). The second structure 200 may include interconnects formed in the logic region (LR) and the second connection region (CR2). The interconnects of the second structure 200 may be electrically coupled to electronic elements and the TSV structure 300 so circuits supported by the second structure 200 and the photoelectric conversion elements supported by the first structure 100 are electrically coupled to allow electrical control and operation of the photoelectric conversion elements in capturing images in the incident light.

The TSV structure 300 may include a first TSV structure (TSV1), a second TSV structure (TSV2), and an electrode pad (PAD).

The first TSV structure (TSV1) may electrically connect the interconnects formed in the first connection region (CR1) to the interconnects formed in the second connection region (CR2) of the second structure 200. For example, the first TSV structure (TSV1) may completely penetrate the first connection region (CR1) in a vertical direction while being electrically coupled to the interconnects formed in the first connection region (CR1). On the other hand, the first TSV structure (TSV1) may penetrate only some regions of the second connection region (CR2) such that a lower end of the first TSV structure (TSV1) can be coupled to the interconnects formed in the second connection region (CR2). Here, the first TSV structure (TSV1) may be formed in a manner that an upper end of the TSV is formed to be lower than a top surface of a semiconductor substrate of the first structure 100 by a predetermined depth or more, so that the TSV is enclosed by inner surfaces of a through hole (also called a via hole) and a passivation layer. The structure of the above-described first TSV structure (TSV1) will be described later in more detail.

The second TSV structure (TSV2) may be electrically coupled to the interconnects formed in the first connection region (CR1), or may be electrically coupled to either the interconnects formed in the first connection region (CR1) or the interconnects formed in the second connection region (CR2). For example, the second TSV structure (TSV2) may penetrate the semiconductor substrate of the first structure 100, and a lower end of the second TSV structure (TSV2) may be electrically coupled to the interconnects formed in the first connection region (CR1). Alternatively, the second TSV structure (TSV2) may penetrate the first connection region (CR1) while being electrically coupled to the interconnects formed in the first connection region (CR1), and the lower end of the second TSV structure (TSV2) may extend to the second connection region (CR2) so that the lower end of the second TSV structure (TSV2) can be coupled to the interconnects formed in the second connection region (CR). The upper end of the second TSV structure (TSV2) may be coupled to the electrode pad (PAD).

In order to form an electrical connection between the first structure 100 (and/or the second structure 200) and the external device, the electrode pad (PAD) may be formed at a back surface of a first substrate 111 in the first connection region (CR1), and may be electrically coupled to the second TSV structure (TSV2).

In some implementations, the first TSV structure (TSV1) may serve to electrically connect the interconnects of the first connection region (CR1) to the interconnects of the second connection region (CR2), without being connected to the electrode pad (PAD). The second TSV structure (TSV2) may be coupled to the electrode pad (PAD), and may serve to electrically connect the pixel region (PR) and the logic region (LR) to the external device.

The first TSV structure (TSV1) may be formed between a region in which the second TSV structure (TSV2) is formed and the pixel region (PR), but is not limited thereto.

Figure 4:
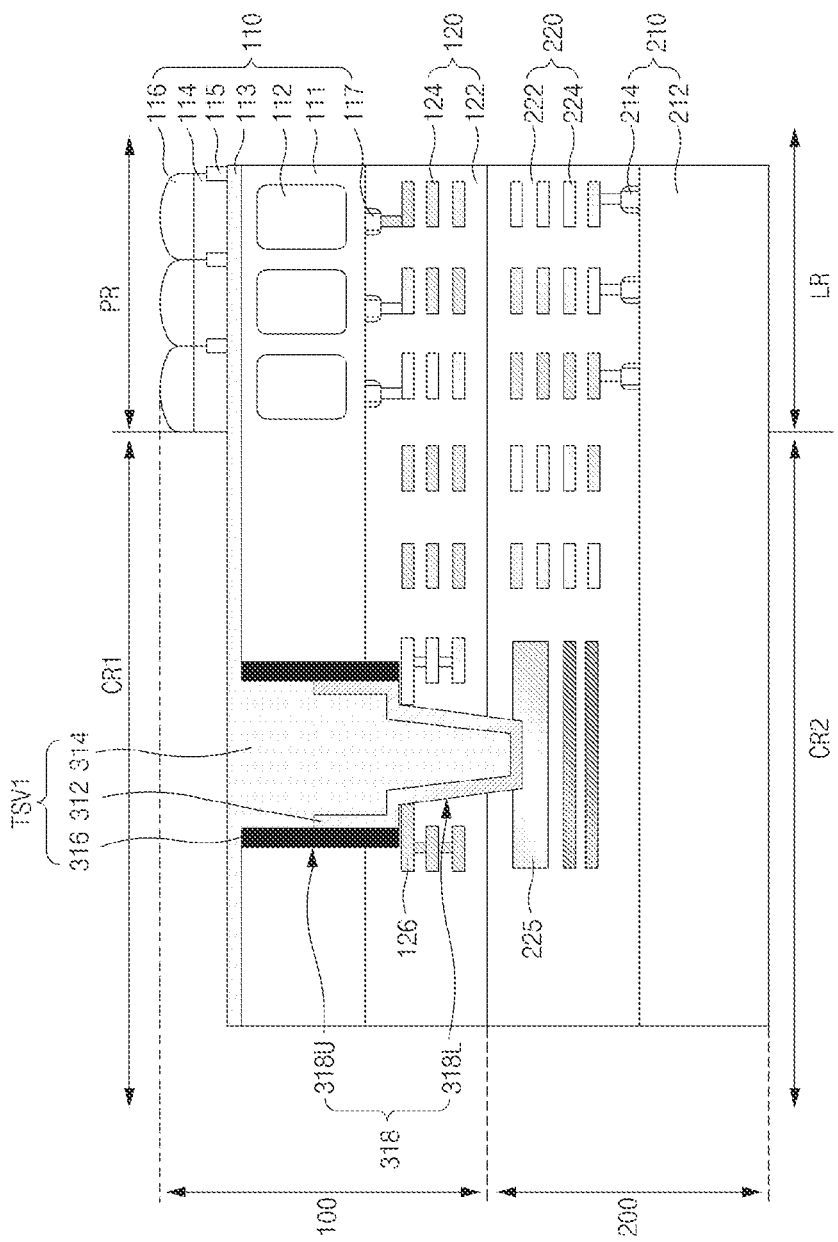
FIG. 4 is a cross-sectional view illustrating an example of a first structure taken along the line X-X' shown in FIG. 3 based on some implementations of the disclosed technology.

FIG. 4 is a cross-sectional view illustrating an example of a first structure 100 taken along the line X-X' shown in FIG. 3 based on some implementations of the disclosed technology.

Referring to FIG. 4, the first structure 100 may include a first substrate layer 110 and a first interconnect layer 120.

The first substrate layer 110 may include a first substrate 111, a photoelectric conversion element 112, a passivation layer 113, color filters 114, a grid structure 115, microlenses 116, and pixel transistors 117.

The first substrate 111 may include a first front surface and a first back surface opposite to the first front surface. The first back surface of the first substrate 111 may be a light reception surface upon which light is incident, and may be formed to have color filters 114 and the microlenses 116 of the unit pixels (PXs). The first front surface of the first substrate 111 may be formed to have pixel transistors 117, and may be in contact with the first interconnect layer 120. That is, the image sensing device may refer to a backside illuminated (BSI) image sensing device. The first substrate 111 may include a semiconductor substrate. For example, the first substrate 111 may be a bulk-silicon substrate or a silicon-on-insulator (SOI) substrate. Alternatively, the first substrate 111 may be formed of an epitaxial layer formed over a base substrate.

A photoelectric conversion element 112 may be formed in the first substrate 111 in the pixel region (PR), and may generate photocharges through photoelectric conversion of incident light received through the first back surface of the first substrate 111. The photoelectric conversion element 112 may generate photocharges in proportion to the increasing amount of incident light. The photoelectric conversion element 112 may include a photodiode, a photo transistor, a photo gate, a pinned photodiode, an organic photodiode, a quantum dot, or a combination thereof, but the disclosed technology is not limited thereto.

A passivation layer 113 may be conformally formed over the first substrate 111 of the pixel region (PR), and may be formed over a through silicon via (TSV) 312 to fill a through hole of the first connection region (CR1). The passivation layer 113 may operate as a planarization layer for planarization of uneven surfaces formed at a first back surface of the first substrate 111 within the pixel region (PR). The passivation layer 113 may include at least one of silicon oxide, silicon nitride, silicon oxynitride, or combinations thereof.

The color filters 114 may be formed over the passivation layer 113 in the pixel region (PR). The color filters 114 may be arranged to correspond to the unit pixels, and may filter visible light from incident light. The color filters 114 may include red, green, or blue color filters arranged in a Bayer pattern. Alternatively, the color filters 114 may include a yellow color filter, a magenta color filter, and a cyan color filter. In addition, the color filters 114 may further include a white filter.

The grid structure 115 may be formed between the color filters 114, and may prevent crosstalk between adjacent color filters.

The microlenses 116 may be formed over the color filters 114. The microlenses 116 may be arranged to correspond to the unit pixels. Each of the microlenses 116 may be formed in a convex shape, and may have a predetermined radius of curvature (RoC) to converge incident light onto the photoelectric conversion element 112. Each of the microlenses 116 may include a light transmissive resin.

Pixel transistors 117 may be formed at the first front surface of the first substrate 111 so that the pixel transistors 117 are respectively coupled to first interconnects 124. The pixel transistors 117 may be formed to correspond to the unit pixels (PXs) in the pixel region (PR). The pixel transistors 117 may generate pixel signals corresponding to the amount of photocharges generated by the photoelectric conversion element 112 of the corresponding unit pixel (PX), and may output the pixel signals through the first interconnects 124. The pixel signals output from the pixel region (PR) may be transferred to logic transistors 214 of the logic region (LR) through the first interconnects 124, the TSV 312, and second interconnects 224. The pixel transistors 117 may include a transfer transistor, a reset transistor, a source follower transistor, and a select transistor. The pixel transistors 117 may be coupled to the first interconnects 124, respectively.

The first interconnect layer 120 may be formed under the first front surface of the first substrate 111, and may be formed to contact a second interconnect layer 220 of the second structure 200. The first interconnect layer 120 may include a first interlayer insulation layer 122, and first interconnects 124 formed in the first interlayer insulation layer 122.

In the pixel region (PR) and the first connection region (CR1), the first interlayer insulation layer 122 may include insulation materials that are disposed among the pixel transistors 117, the first TSV structures (TSV1), and the first interconnects 124. The first interlayer insulation layer 122 may include at least one of silicon oxide, silicon nitride, and silicon oxynitride.

The first interconnects 124 may be formed in the first interlayer insulation layer 122 within the pixel region (PR) and the first connection region (CR1), and may electrically connect the pixel transistors 117 to the first TSV structure (TSV1). In addition, the first interconnects 124 may electrically interconnect the pixel transistors 117 within the pixel region (PR), or may electrically connect the second TSV structure (TSV2) to the unit pixels (PXs). The first interconnects 124 may be formed in a multilayer structure.

Figure 5:
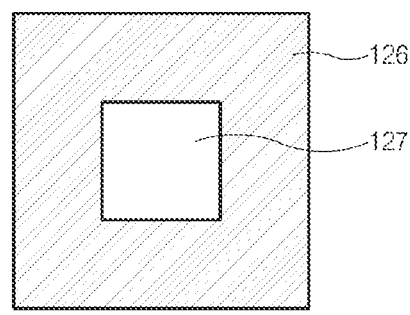
FIG. 5 is a diagram illustrating an example of a planar structure of a through silicon via (TSV) pad shown in FIG. 4 based on some implementations of the disclosed technology.

Among the plurality of first interconnects 124, a interconnect 126 contacting the first TSV structure (TSV1) may be formed in an annular pad (e.g., TSV pad) shape in which an opening 127 is formed at the center thereof as shown in FIG. 5. Although only the first TSV structure (TSV1) is shown in FIG. 4 for convenience of description, other implementations are also possible, it should be noted that the first interconnects 124 can also be electrically coupled to the second TSV structure (TSV2) as needed.

The second structure 200 may include a second substrate layer 210 and a second interconnect layer 220.

The second substrate layer 210 may include a second substrate 212 and a plurality of logic transistors 214.

The second substrate 212 may include a second front surface and a second back surface opposite to the second front surface. The second front surface of the second substrate 212 may be a surface on which the logic transistors are formed, and may be in contact with the second interconnect layer 220. The second substrate 212 may include a semiconductor substrate such as a first substrate.

The logic transistors 214 may be formed at the second front surface of the second substrate 212 such that the logic transistors 214 can be coupled to the second interconnects 224. The logic transistors 214 may generate control signals to control operations of the unit pixels (PXs), and may process the pixel signals output from the unit pixels (PXs), resulting in formation of an image. For example, the logic transistors 214 may include transistors configured to construct the row driver 20, the CDS 30, the ADC 40, the output buffer 50, the column driver 60, and the timing controller 70 shown in FIG. 1. The logic transistors 214 may be formed in the logic region (LR) of the second substrate 212. The logic transistors 214 may receive pixel signals through the first interconnects 124, the TSV 312, and the second interconnects 224.

The second interconnect layer 220 may be formed over the second front surface of the second substrate 212, and may be formed to contact the first interconnect layer 120 of the first structure 100. The second interconnect layer 220 may include a second interlayer insulation layer 222, and second interconnects 224 formed in the second interlayer insulation layer 222.

In the logic region (LR) and the second connection region (CR2), the second interlayer insulation layer 222 may include insulation materials that are disposed among the logic transistors 214, the first TSV structures (TSV1), and the second interconnects 224. The second interlayer insulation layer 222 may include at least one of silicon oxide, silicon nitride, and silicon oxynitride.

The second interconnects 224 may be formed in the second interlayer insulation layer 222 within each of the logic region (LR) and the second connection region (CR2), and may electrically connect the logic transistors 214 to the first TSV structure (TSV1). In addition, the second interconnects 224 may electrically connect the logic transistors 214 to each other within the logic region (LR), or may electrically connect the second TSV structure (TSV2) to the logic transistors 214. The second interconnects 224 may be formed in a multilayer structure. Among the second interconnects 224, a interconnect 225 contacting a lower end of the first TSV structure (TSV1) may be formed to be thicker than other interconnects. Although only the first TSV structure (TSV1) is shown in FIG. 4 for convenience of description, the second interconnects 224 may also be coupled to the second TSV structure (TSV2).

The first TSV structure (TSV1) may include a TSV 312, a passivation layer 314, and a sidewall insulation layer 316.

The TSV 312 may include metal such as copper (Cu) or tungsten (W), and may electrically connect the interconnect (TSV pad) 126 formed in the first interconnect layer 120 to the interconnect 225 formed in the second interconnect layer 220. For example, the first substrate 111 and the first interlayer insulation layer 122 may be penetrated to expose the TSV pad 126 in the first connection region (CR1) and a portion of the second interlayer insulation layer 222 may be etched to expose the interconnect 225 in the second connection region (CR2), resulting in formation of the through hole 318. A metal material may be formed to conformally extend along the inner surface (e.g., side and bottom surfaces) of the through hole 318, resulting in formation of the TSV 312. The through hole 318 may include an upper through-hole 318U and a lower through-hole 318L. In one example, the upper through-hole 318U indicates an upper portion of the through hole 318, and the lower through-hole 318L indicates a lower through-hole 318L. In some implementations, the upper through-hole 318U may be formed to have a constant size (width) from the first back surface of the first substrate 111 to the TSV pad 126, and the lower through-hole 318L may be formed in a shape that gradually decreases in width from the opening 127 of the TSV pad 126 to the interconnect 225. Accordingly, the through silicon via (TSV) 312 may be formed in a cup shape in which an upper region thereof is formed to have a constant width and a lower region thereof is formed to gradually decrease in width while having an empty inner space. In some implementations, the through silicon via (TSV) 312 may include a thin layer formed along inner surfaces of the through hole 318, leaving empty spaces over the through silicon via (TSV) 312. In some implementations, the TSV 312 based on some implementations of the disclosed technology may be formed such that an upper end of the TSV 312 is formed to be lower than the first back surface of the first substrate 111.

The passivation layer 314 may be formed to cover the TSV 312. For example, the passivation layer 314 may be formed over the TSV 312 to fill the through hole 318. The passivation layer 314 may include the same materials as in the passivation layer 113 of the pixel region (PR). In this case, the passivation layer 113 may be formed simultaneously with formation of the passivation layer 314. The passivation layer 314 may include a hydrophobic material capable of preventing penetration of moisture or humidity.

In some implementations, since the upper end of the TSV 312 is formed to be lower than the first back surface of the first substrate 111, the TSV 312 may be formed on inner surfaces of the through hole 318 and covered by the passivation layer 314 such that the TSV 312 is enclosed by the inner surfaces of the through hole 318 and the passivation layer 314. Therefore, the TSV 312 can be more safely protected from external moisture or temperature change.

The sidewall insulation layer 316 may be formed at an outer sidewall of the TSV 312 within the upper through-hole 318U. The sidewall insulation layer 316 may include an insulation layer structured to electrically isolate the TSV 312 and the pixel region (PR) from each other within the first substrate 111 without requiring an additional isolation structure in the first substrate 111.

Although FIG. 4 illustrates only the first TSV structure (TSV1) for convenience of description, the remaining parts of the second TSV structure (TSV2) other than characteristics of the upper end of the TSV that is formed to extend over the first back surface of the first substrate 111 so that the upper end of the TSV is electrically coupled to a conductive pad (PAD) may be formed to have the same structure as the first TSV structure (TSV1). For example, the TSV of the second TSV structure (TSV2) may be formed in a manner that a metal material is conformally formed along the inner surface of the through hole, and a passivation layer may be formed over the TSV to fill the through hole (e.g., vacant space remaining after forming the TSV in the through hole). In this case, the TSV and the passivation layer of the second TSV structure (TSV2) may be formed of the same materials as in the TSV 312 and the passivation layer 314 of the first TSV structure (TSV1), and may be formed together with the TSV 312 and the passivation layer 314 of the first TSV structure (TSV1) by the same process.

FIGS. 6A to 6G are cross-sectional views illustrating examples of a method for forming the first TSV structure 100 shown in FIG. 4 based on some implementations of the disclosed technology.

Figure 6A:
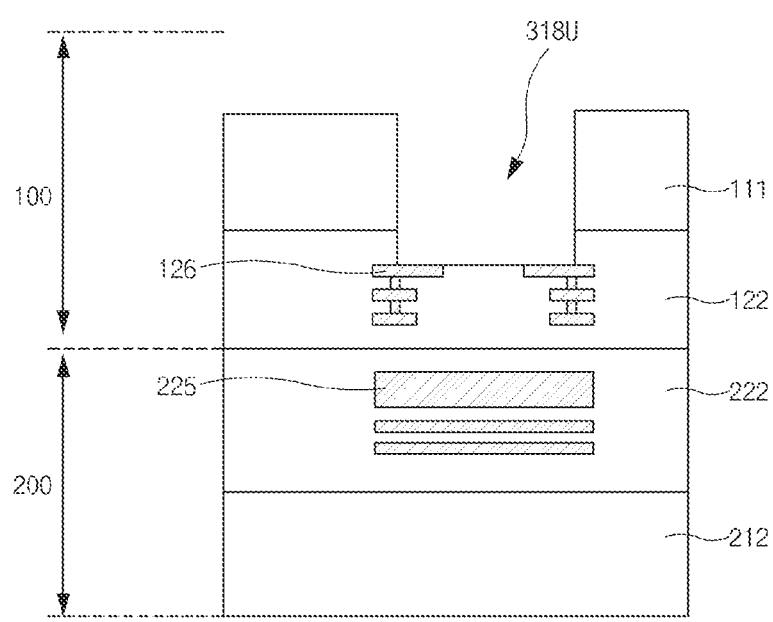
FIGS. 6A to 6G are cross-sectional views illustrating examples of a method for forming the first TSV structure shown in FIG. 4 based on some implementations of the disclosed technology.

Referring to FIG. 6A, after the first structure 100 and the second structure 200 are bonded such that the first interlayer insulation layer 122 and the second interlayer insulation layer 222 are in contact with each other, the first substrate 111 and the first interlayer insulation layer 122 are etched from the first back surface of the first substrate 111 until the TSV pad 126 is exposed, resulting in formation of the upper through-hole 318U.

The upper through-hole 318U may be formed to have a constant size (width) from the first back surface of the first substrate 111 to the TSV pad 126, and the opening 127 of the TSV pad 126 may be disposed at the center portion of the bottom surface of the upper through-hole 318U.

Figure 6B:
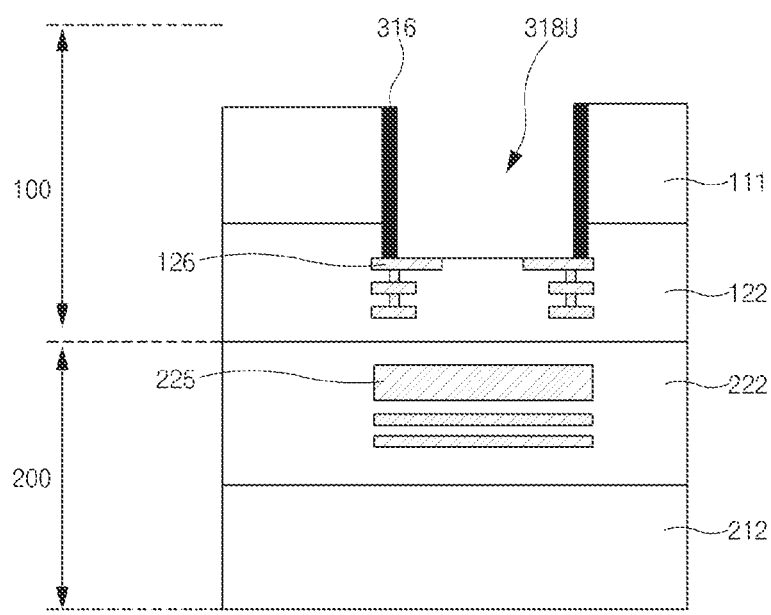

Referring to FIG. 6B, an insulation layer (not shown) may be disposed over the first back surface of the first substrate 111 and the inner surface of the upper through-hole 318U. Subsequently, a blanket etch process can be performed on the insulation layer such that the insulation layer remains only at a sidewall of the upper through-hole 318U. In this way, a sidewall insulation layer 316 is formed.

Figure 6C:
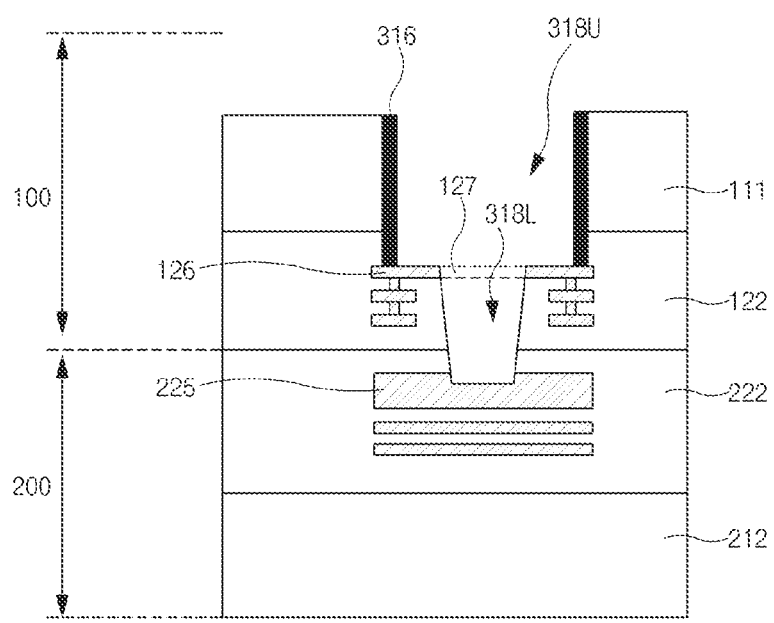

Referring to FIG. 6C, the first interlayer insulation layer 122 and the second interlayer insulation layer 222 are etched using the TSV pad 126 as an etch mask until the interconnect 225 is exposed outside, resulting in formation of the lower through-hole 318L. For example, in each of the first interlayer insulation layer 122 and the second interlayer insulation layer 222, a region located below the opening 127 of the TSV pad 126 may be etched to form the lower through-hole 318L.

Figure 6D:
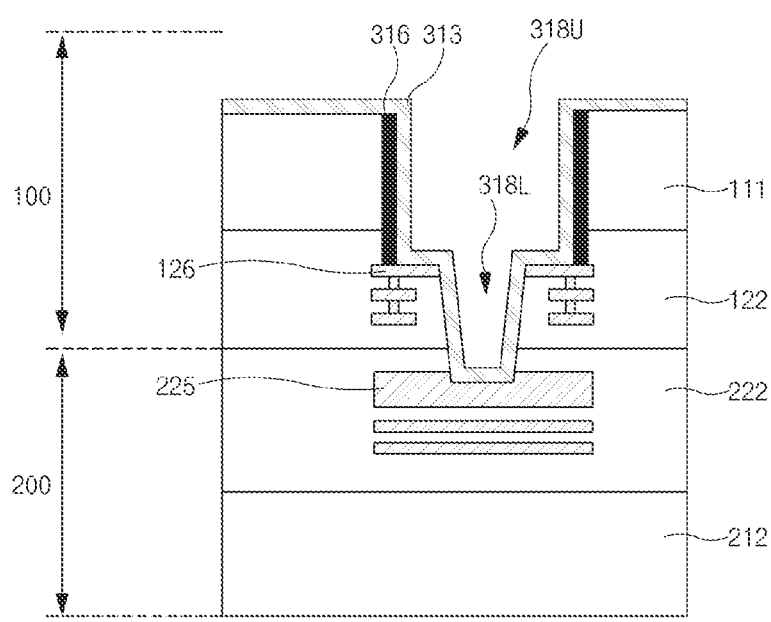

Referring to FIG. 6D, a conductive layer 313 for TSV (hereinafter referred to as a TSV conductive layer) may be formed along the first back surface of the first substrate 111, the inner surface of the upper through-hole 318U and the inner surface of the lower through-hole 318L. In some implementations, the TSV conductive layer 313 may include metal such as copper (Cu) or tungsten (W).

Figure 6E:
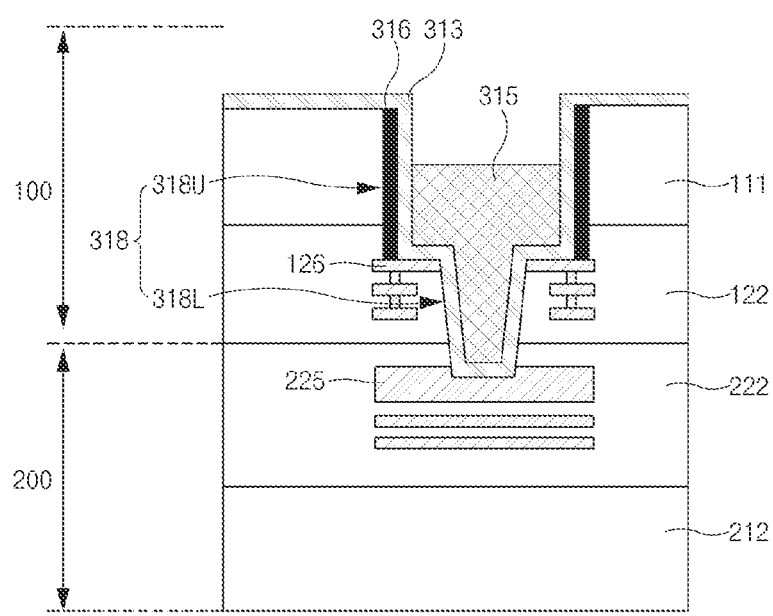

Referring to FIG. 6E, a sacrificial layer 315 may be formed in the lower through-hole 318L and the upper through-hole 318U such that the lower through-hole 318L is completely filled with the sacrificial layer 315 and the upper through-hole 318U is partially filled with the sacrificial layer 315. For example, in the vacant space formed over the TSV conductive layer 313 in the lower through-hole 318L and the upper through-hole 318U, the sacrificial layer may be formed to fill the vacant space formed over the TSV conductive layer 313 in the lower through-hole 318L and fill a lower portion of the vacant space in the upper through-hole 318U. An upper portion of the vacant space in the upper through-hole 318U remains empty, and thus the TSV conductive layer 313 at the upper portion of the upper through-hole 318U is exposed. The sacrificial layer 315 may include a photoresist layer.

Figure 6F:
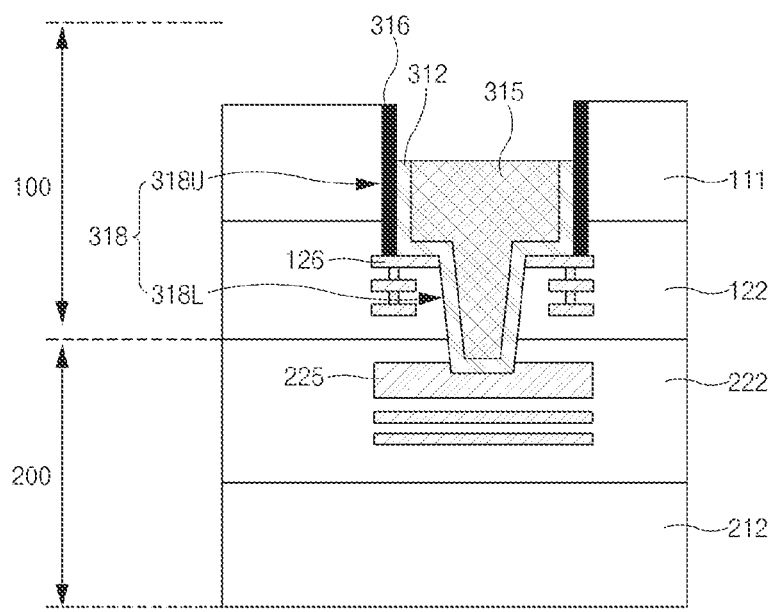

Referring to FIG. 6F, the exposed TSV conductive layer 313 at the upper portion of the upper through-hole 318U is removed to form the TSV 312.

Figure 6G:
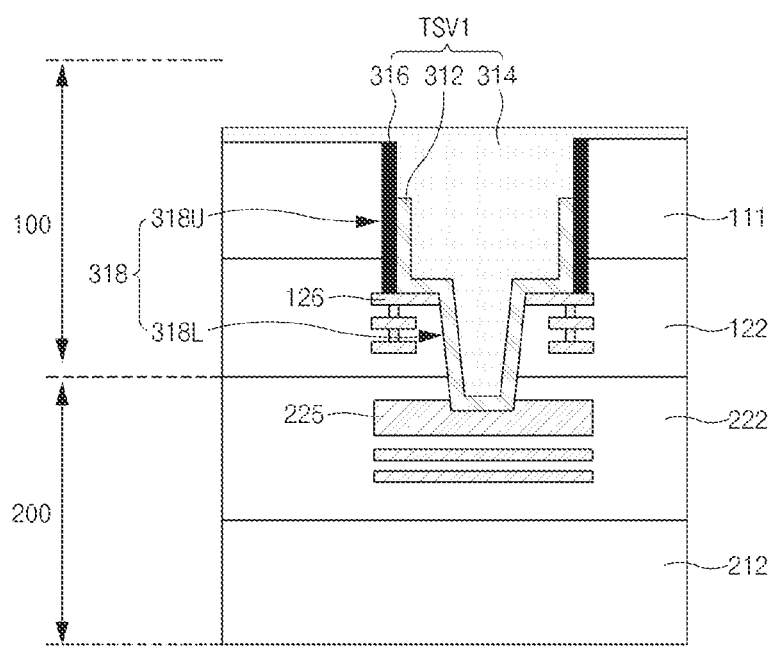

Referring to FIG. 6G, the sacrificial layer 315 is removed to form a vacant space over the TSV 312, and the passivation layer 314 may be formed over the TSV 312 to fill the vacant space over the TSV 312. In this way, the through hole 318 is completely filled with the TSV 312 and the passivation layer 314 such that the TSV 312 is enclosed by the inner surfaces of the through hole 318 and the passivation layer 314. The passivation layer 314 may be formed to extend over the first back surface such that the first back surface of the first substrate 111 can be covered with the passivation layer 314. The passivation layer 314 may include the same material as in the passivation layer 113 of the pixel region (PR). In some implementations, the passivation layer 113 may be formed together with the passivation layer 314. The passivation layer 314 may include a hydrophobic material capable of preventing penetration of moisture or humidity.

As is apparent from the above description, the image sensing device based on some implementations of the disclosed technology can improve reliability, such as reliability that can be measured by using a Temperature Humidity with Bias (THB) testing, by preventing the through silicon via (TSV) structure from being exposed outside the substrate.

Although a number of illustrative embodiments have been described, it should be understood that various modifications or enhancements of the disclosed embodiments and other embodiments can be devised based on what is described and/or illustrated in this patent document.

What is claimed is:

1. An image sensing device comprising:
   a first substrate including a first front surface and a first back surface opposite to the first front surface;
   a first interlayer insulation layer disposed below the first front surface and structured to include a first interconnect;
   a second substrate including a second front surface and a second back surface opposite to the second front surface;
   a second interlayer insulation layer disposed over the second front surface and below the first interlayer insulation layer to be in contact with the first interlayer insulation layer, the second interlayer insulation layer structured to include a second interconnect;
   a first through silicon via (TSV) disposed in a through hole that is formed by penetrating the first substrate and the first interlayer insulation layer and by etching of a portion of the second interlayer insulation layer, the first TSV structured to electrically connect the first interconnect to the second interconnect; and
   a passivation layer structured to cover the first TSV and fill the through hole,
   wherein the first TSV includes a lower end in contact with the second interconnect and an upper end opposite to the lower end, and
   wherein the upper end of the first TSV is located at a height lower than the first back surface within the through hole.

2. The image sensing device according to claim 1, further comprising:

a sidewall insulation layer disposed between the first substrate and the first TSV within the through hole.

3. The image sensing device according to claim 2, wherein:
the first TSV is formed such that an upper end of the first TSV is located at a height lower than an upper end of the sidewall insulation layer.

4. The image sensing device according to claim 1, wherein:
the first interconnect includes a through silicon via (TSV) pad that is formed in an annular shape while having an opening at a center portion of the TSV pad; and
the first TSV formed to electrically connect the first interconnect to the second interconnect while penetrating the opening.

5. The image sensing device according to claim 4, wherein the through hole includes:
an upper through-hole formed to have a constant width from the first back surface to the TSV pad; and
a lower through-hole formed to gradually decrease in width from the opening to the second interconnect.

6. The image sensing device according to claim 1, wherein:
the first TSV is conformally formed along a portion of an inner surface of the through hole.

7. The image sensing device according to claim 1, further comprising:
an electrode pad formed over the first back surface for electrical connection to an external device,
wherein the first TSV is not electrically coupled to the electrode pad.

8. The image sensing device according to claim 7, further comprising:
a second through silicon via (TSV) spaced apart from the first TSV by a predetermined distance, and electrically coupled to the electrode pad.

9. The image sensing device according to claim 1, wherein the first substrate includes:
a plurality of photoelectric conversion elements structured to generate photocharges through conversion of incident light.

10. The image sensing device according to claim 9, further comprising:
pixel transistors disposed on the first front surface to be coupled to the first interconnect, and structured to generate pixel signals corresponding to the amount of photocharges generated by the corresponding photoelectric conversion element.

11. The image sensing device according to claim 10, further comprising:
logic transistors disposed on the second front surface to be coupled to the second interconnect, and structured to generate control signals for controlling operations of the pixel transistors and to process the pixel signals, resulting in formation of one or more images.

12. The image sensing device according to claim 9, further comprising:
color filters disposed over the first back surface in correspondence to the photoelectric conversion elements; and
microlenses disposed over the color filters.

13. An image sensing device comprising:
a first structure including:
a first substrate structured to include a plurality of unit pixels generating pixel signals through conversion of incident light; and
a first interlayer insulation layer structured to cover the first substrate and include a first interconnect that transmits the pixel signals;
a second structure in contact with a front surface of the first structure, the second structure including:
a second substrate structured to include electronic elements that generate images by processing the pixel signals; and
a second interlayer insulation layer structured to cover the second substrate and include a second interconnect that transmits the pixel signals to the electronic elements; and
a through silicon via (TSV) structured to electrically connect the first interconnect to the second interconnect,
wherein the TSV includes a first end portion in contact with the second interconnect and a second end portion opposite to the first end portion, and
wherein, at a back surface of the first substrate, the second end portion of the TSV is located at a height lower than a surface of the first substrate.

14. The image sensing device according to claim 13, wherein:
the TSV is conformally formed along a portion of an inner surface of a through hole that vertically penetrates the first structure and penetrates a portion of the second structure.

15. The image sensing device according to claim 14, further comprising:
a passivation layer disposed over the TSV to fill the through hole.

16. The image sensing device according to claim 14, further comprising:
a sidewall insulation layer disposed between the first substrate and the TSV within the through hole.

17. The image sensing device according to claim 13, wherein the first interconnect includes:
a through silicon via (TSV) pad formed in an annular shape, and structured to include an opening located at a center portion of the TSV pad,
wherein the TSV is structured to electrically connect the first interconnect to the second interconnect while penetrating the opening.

18. An image sensing device comprising:
a first substrate;
a plurality of image sensing pixels supported by the first substrate and configured to respond to incident light to generate photocharge, wherein output signals from the image sensing pixels collectively carry image information in the incident light;
a first interlayer insulation layer disposed below the first substrate and structured to include a first interconnect;
a second substrate disposed below the first interlayer insulation layer;
imaging sensing circuits supported by the second substrate and structured to include driving circuits for operating the image sensing pixels;
a second interlayer insulation layer disposed between the first interlayer insulation layer and the second substrate, the second interlayer insulation layer structured to include a second interconnect;
a first through silicon via (TSV) formed in a through hole penetrating the first substrate, the first interlayer insulation layer and an upper portion of the second interlayer insulation layer, the first TSV structured to electrically connect the first interconnect to the second interconnect to provide electrical connections between the imaging sensing circuits and the image sensing pixels; and a passivation layer formed to cover the first TSV and fill the through hole, wherein the first TSV is formed between an inner surface of the through hole and the passivation layer and enclosed by the inner surface of the through hole and the passivation layer within the through hole.

19. The image sensing device according to claim 18, wherein the first TSV has a shape that tapers towards upper portion of the second interlayer insulation layer.

20. The image sensing device according to claim 18, wherein the first TSV has a cup shape that is disposed over the through hole and is filled with the passivation layer.

* * * * *